United States Patent [19]
Kishi

[11] Patent Number: 6,133,605
[45] Date of Patent: Oct. 17, 2000

[54] SEMICONDUCTOR NONVOLATILE MEMORY TRANSISTOR AND METHOD OF FABRICATING THE SAME

[75] Inventor: Toshiyuki Kishi, Tokorozawa, Japan

[73] Assignee: Citizen Watch Co., Ltd., Tokyo, Japan

[21] Appl. No.: 09/040,392

[22] Filed: Mar. 18, 1998

[30]     Foreign Application Priority Data

Mar. 19, 1997 [JP] Japan .................................. 9-066262

[51] Int. Cl.[7] .................................................. H01L 29/72
[52] U.S. Cl. .......................... 257/325; 257/324; 257/410; 257/411; 438/216; 438/724
[58] Field of Search .................................. 257/325, 324, 257/410, 411; 438/216, 724

[56]           References Cited

U.S. PATENT DOCUMENTS 5,293,062   3/1994   Nakao ...................................... 257/325
5,496,753   3/1996   Sakurai et al. ............................ 257/325

*Primary Examiner*—Edward Wojciechowicz
*Attorney, Agent, or Firm*—Armstrong, Westerman, Hattori, McLeland, & Naughton

[57]             ABSTRACT

A MONOS nonvatile memory transistor includes a semiconductor substrate, a memory insulator film on the semiconductor substrate composed of a tunnel insulator film, a memory nitride film and a top oxide film, and a memory gate electrode on the memory insulator film. The tunnel insulator film is constituted of a silicon nitrided oxide film containing oxygen and nitrogen and an oxygen-rich silicon nitrided oxide film or a silicon oxide film to make the nitrogen content of the tunnel insulator film in the vicinity of its interface with the semiconductor substrate greater than its nitrogen content in the vicinity of its interface with the memory nitride film. By this, the barrier height of the tunnel insulator film to holes in the semiconductor substrate is lowered without lowering the barrier height thereof to holes captured on the memory nitride film side.

9 Claims, 12 Drawing Sheets

SEMICONDUCTOR NONVOLATILE MEMORY TRANSISTOR AND METHOD OF FABRICATING THE SAME

BACKGROUND OF THE INVENTION

1. Field of the Invention

This invention relates to a semiconductor nonvolatile memory transistor structure and a method of fabricating the same, particularly to a technology for improving the memory characteristic and enhancing the reliability of a semiconductor nonvolatile memory transistor having a memory insulator film composed of a tunnel insulator film, a memory nitride film and a top oxide film and known as the MONOS (Metal Oxide Nitride Oxide Semiconductor).

2. Description of the Related Art

Data rewrite of a MONOS nonvolatile memory transistor is generally effected by applying bias voltage to the memory gate electrode to inject electrons or holes from the semiconductor substrate through the tunnel insulator film into the memory nitride film, the interface between the tunnel insulator film and the memory nitride film, and the interface between the memory nitride film and the top oxide film.

The structure of the conventional MONOS nonvolatile memory transistor will be explained with reference to the schematic sectional view of FIG. 25.

As shown in FIG. 25, a MONOS structure is configured by providing a field oxide film 2 around a memory device region on the surface of a semiconductor substrate 1 exhibiting P-type conductivity (first conductivity type), providing a tunnel insulator film 31, a memory nitride film 5 and a top oxide film 6 on the memory device region of the semiconductor substrate 1 to constitute a memory insulator film 8, and providing a memory gate electrode 9 on the memory insulator film 8.

A source 10 and a drain 11 composed of heavily doped layers exhibiting N-type conductivity (second conductivity type) are further provided on the memory device region of the semiconductor substrate 1 in self-alignment with the memory gate electrode 9.

An interlevel insulator 12 composed mainly of a silicon dioxide film is provided over the whole surface of the semiconductor substrate 1 and interconnections 14 are provided through contact holes 13 formed in the interlevel insulator 12 to contact the source 10, the drain 11 and, though not illustrated, the memory gate electrode 9.

Data rewrite of such a conventional MONOS nonvolatile memory transistor is effected by applying bias voltage to the memory gate electrode 9.

Specifically, in the case of an N-channel memory transistor, positive bias voltage is applied to the memory gate electrode 9, and the semiconductor substrate 1, the source 10 and the drain 11 are grounded to cause electrons to be injected from the semiconductor substrate 1 through the tunnel insulator film 31 into the memory insulator film 8 to be captured in the memory nitride film 5, at the interface between the tunnel insulator film 31 and the memory nitride film 5, and at the interface between the memory nitride film 5 and the top oxide film 6.

The threshold voltage of the N-channel MONOS nonvolatile memory transistor after electron capture is higher than normal. That is, enhancement operation occurs. This is called the write state.

If, oppositely from this, the memory gate electrode 9 is grounded and positive bias voltage is applied to the semiconductor substrate 1, the source 10 and the drain 11, holes are injected from the semiconductor substrate 1 through the tunnel insulator film 31 into the memory insulator film 8 to be captured in the memory nitride film 5, at the interface between the tunnel insulator film 31 and the memory nitride film 5, and at the interface between the memory nitride film 5 and the top oxide film 6.

The threshold voltage of the N-channel MONOS nonvolatile memory transistor after hole capture is lower than normal. That is, depletion operation occurs. This is called the erase state.

Thus in the MONOS nonvolatile memory transistor, data write is effected by injecting electrons or holes from the semiconductor substrate 1 through the tunnel insulator film 31 into the memory insulator film 8 to establish the write state or the erase state.

In the case of a P-channel memory transistor, the relationship between the polarity of the bias voltage and the write state/erase state is reversed from that of the N-channel memory transistor explained above. That is, it assumes write state when holes are injected and assumes erase state when electrons are injected.

In either case, the data rewrite operation of the MONOS nonvolatile memory transistor depends heavily on the thickness, material and properties of the tunnel insulator film 31.

When the thickness of the tunnel insulator film 31 is increased, for instance, the injection efficiency of electrons and holes from the semiconductor substrate decreases. This lowers the write speed and, by decreasing the number of electrons and holes injected, reduces the number captured. Data write therefore becomes difficult.

As a result, the conventional tunnel insulator film 31 has been constituted as a silicon nitrided oxide film formed by nitridation of a silicon oxide film.

The operation of this silicon nitrided oxide film will be explained with reference to the energy band diagram shown in FIG. 26.

In the energy band diagram shown in FIG. 26, the energy state is represented vertically and the structure of the memory insulator film 8 of the MONOS nonvolatile memory transistor is represented horizontally.

This energy band diagram shows the erase operation of an N-channel MONOS nonvolatile memory transistor when positive bias voltage is applied to the semiconductor substrate 1. The film structure is represented as slanted proportionally to the bias.

When the tunnel insulator film 31 of the memory insulator film 8 is constituted as the silicon oxide film 32 represented in broken lines, the barrier height of the silicon oxide film 32 to holes from the semiconductor substrate 1 (lower side in FIG. 26) is, at about 3.8 eV, higher than the approximately 3.2 eV barrier height of the silicon oxide film 32 to electrons (upper side in FIG. 26).

As a result, the write speed on the erase side, which generally involves hole injection, is decreased when the silicon oxide film 32 is used as the tunnel insulator film 31.

Because of this, the practice is to improve the speed on the erase side by using as the tunnel insulator film 31 of the memory insulator film 8 a silicon nitrided oxide film obtained by nitridation of the silicon oxide film 32.

Specifically, use of the silicon nitrided oxide film 3 represented in solid lines in FIG. 26 in place of the silicon oxide film 32 makes the barrier height to holes from the semiconductor substrate 1 (lower side in FIG. 26) about 3.3 eV, lower than the barrier height of the silicon oxide film 32

(about 3.8 eV). As a result, the hole injection efficiency is improved and the speed of the erase operation increased.

However, since the barrier height of the tunnel insulator film 31 is also lowered from the viewpoint of holes captured in the memory nitride film 5, at the interface between the tunnel insulator film 31 and the memory nitride film 5, and at the interface between the memory nitride film 5 and the top oxide film 6, holes escape more readily to the side of the semiconductor substrate 1. This degrades the data retention characteristic.

In the case of the P-channel MONOS nonvolatile memory transistor, the speed of the write operation is increased owing to the improvement in the hole injection efficiency but the data retention characteristic is again degraded because captured holes escape readily to the side of the semiconductor substrate 1.

Thus, even in the conventional MONOS nonvolatile memory transistor, the speed of the erase operation or the write operation can be increased by adopting a silicon nitrided oxide film as the tunnel insulator film of the memory insulator film and thereby improving the injection efficiency of holes in the erase operation or the write operation.

However, use of a silicon nitrided oxide film as the tunnel insulator film lowers the barrier height of the tunnel insulator film from the viewpoint of the holes that the erase operation or the write operation causes to be captured in the memory nitride film, at the interface between the tunnel insulator film and the memory nitride film, and at the interface between the memory nitride film 5 and the top oxide film of the memory insulator film, thereby allowing the holes to escape easily to the side of the semiconductor substrate and thus degrading the data retention characteristic.

SUMMARY OF THE INVENTION

This invention was accomplished to overcome these problems. An object of the invention is to enable a MONOS-type semiconductor nonvolatile memory transistor to perform erase operation or write operation at high speed without degrading the data retention characteristic.

Specifically, the write speed and the data retention characteristic of a MONOS nonvolatile memory transistor are improved and a highly reliable semiconductor nonvolatile memory transistor and a method of fabricating the same are provided.

For this, the invention provides a semiconductor nonvolatile memory transistor comprising a semiconductor substrate, a memory insulator film on the semiconductor substrate composed of a tunnel insulator film, a memory nitride film and a top oxide film, and a memory gate electrode on the memory insulator film, the tunnel insulator film being constituted of a silicon nitrided oxide film containing oxygen and nitrogen, and a nitrogen content of the tunnel insulator film in the vicinity of an interface with the semiconductor substrate being greater than a nitrogen content thereof in the vicinity of an interface with the memory nitride film.

In this semiconductor nonvolatile memory transistor, the tunnel insulator film can be constituted in the vicinity of the interface with the semiconductor substrate of a silicon nitrided oxide film whose nitrogen content is greater than its oxygen content and be constituted in the vicinity of its interface with the memory nitride film of an oxygen-rich silicon nitrided oxide film whose oxygen content is greater than its nitrogen content.

Otherwise, the tunnel insulator film can be constituted in the vicinity of its interface with the semiconductor substrate of a silicon nitride film and be constituted in the vicinity of its interface with the memory nitride film of a silicon oxide film.

The method of fabricating a semiconductor nonvolatile memory transistor according to the invention includes the following steps:

a step of forming a pad oxide film on a semiconductor substrate of a first conductivity type, a step of forming a silicon nitride film on the pad oxide film, a step of etching the silicon nitride film by photoetching to leave a memory device region on the semiconductor substrate, a step of forming a field oxide film around the memory device region by selective oxidation using silicon nitride film left at the memory device region as an oxidation-resistant mask, a step of removing the silicon nitride film and the pad oxide film from the semiconductor substrate, a step of forming a sacrificial oxide film on the semiconductor substrate by oxidation, a step of removing the sacrificial oxide film, a step of forming on the memory device region of the semiconductor substrate a tunnel insulator film composed of a silicon nitrided oxide film containing oxygen and nitrogen and having a nitrogen content in the vicinity of an interface with the semiconductor substrate that is greater than a nitrogen content in the vicinity of its surface, a step of forming a memory nitride film on the tunnel insulator film, a step of forming on the memory nitride film a top oxide film composed a silicon oxide film, a step of forming a memory gate electrode on the top oxide film, a step of forming a source and a drain composed of heavily doped layers of a second conductivity type at regions of the memory device region of the semiconductor substrate self-aligned with the memory gate electrode, a step of forming an interlevel insulator composed mainly of a silicon dioxide film over the whole surface a step of annealing to activate the heavily doped layers, a step of forming contact holes by photoetching at locations of the interlevel insulator corresponding to the memory gate electrode, the source and the drain, and a step of forming interconnections through the contact holes to connect with the memory gate electrode, the source and the drain.

The step of forming the tunnel insulator film can be composed of the following steps:

a step of forming a silicon oxide film on the memory device region of the semiconductor substrate by oxidation, a step of nitriding the silicon oxide film into a silicon nitrided oxide film constituting a tunnel insulator film, and a step of further nitriding the silicon nitrided oxide film at the vicinity of a surface thereof to make the vicinity of the surface into an oxygen-rich silicon nitrided oxide film whose oxygen content is high.

Otherwise, the step of forming the tunnel insulator film can be composed of the following steps:

a step of forming a silicon oxide film on the memory device region of the semiconductor substrate by oxidation, a step of nitriding the silicon oxide film into a silicon nitrided oxide film constituting a tunnel insulator film, and a step of further treating the silicon nitrided oxide film in a nitrogen atmosphere containing oxygen to make the vicinity of a surface thereof into an oxygen-rich silicon nitrided oxide film whose oxygen content is great.

Moreover, the step of forming the tunnel insulator film can be composed of the following steps:

a step of effecting nitridation to form on a surface of the memory device region on the semiconductor substrate a silicon nitrided oxide film constituting a tunnel insulator film, and a step of further annealing the silicon nitrided oxide film in an oxygen atmosphere to make the vicinity of a surface thereof into an oxygen-rich silicon nitrided oxide film whose oxygen content is great.

Still further, the step of forming the tunnel insulator film can be composed of the following steps:

a step of forming a silicon oxide film on the memory device region of the semiconductor substrate by oxidation, and a step of injecting nitrogen ions into the silicon oxide film and then effecting annealing in a nitrogen atmosphere containing oxygen to form a tunnel insulator film composed of a silicon nitrided oxide film whose nitrogen content is greater than its oxygen content in the vicinity of an interface thereof with the semiconductor substrate and whose oxygen content is greater than its nitrogen content in the vicinity of a surface thereof.

Further, when the tunnel insulator film is constituted of a silicon nitride film in the vicinity of its interface with the semiconductor substrate and is constituted of a silicon oxide film in the vicinity of its interface with the memory nitride film, the step of forming the tunnel insulator film can be composed of the following steps:

a step of forming a silicon oxide film on the memory device region of the semiconductor substrate by oxidation, a step of nitriding the silicon oxide film into a silicon nitrided oxide film constituting a tunnel insulator film, and a step of effecting a CVD process to form on a surface of the silicon nitrided oxide film a thin silicon oxide film constituting a portion of the tunnel insulator film.

The above and other objects, features and advantages of the invention will be apparent from the following detailed description which is to be read in conjunction with the accompanying drawings.

DETAILED DESCRIPTION OF THE PREFERRED EMBODIMENTS

Preferred embodiments of the structure and the method of fabricating a MONOS nonvolatile memory transistor according to the invention will now be explained in detail with reference to the drawings.

Figure 1:
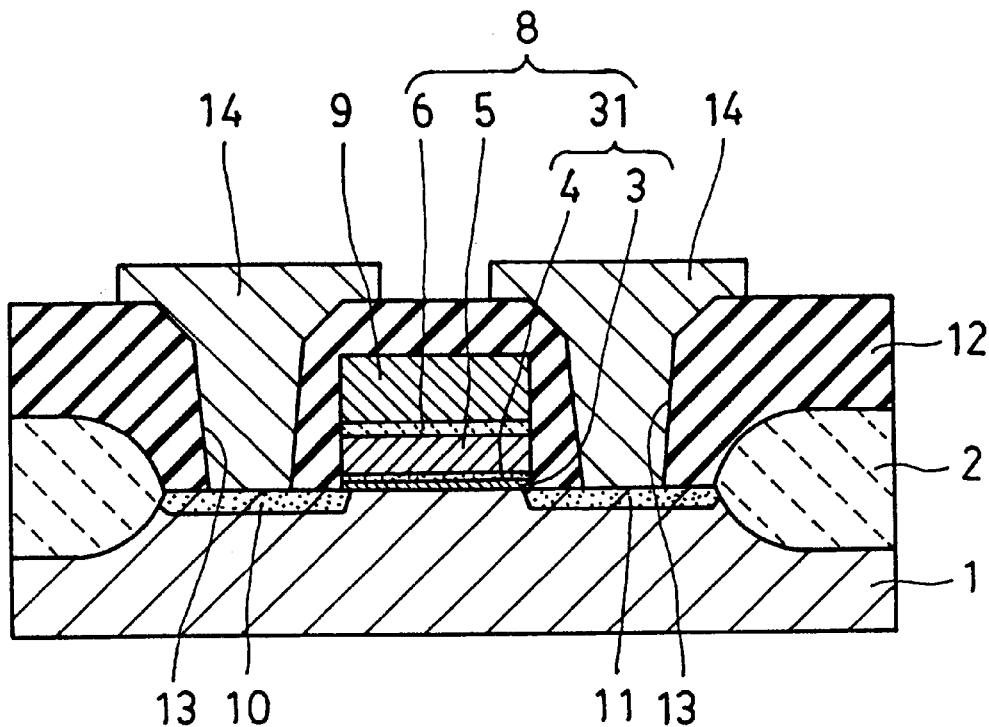
FIG. 1 is a schematic sectional view showing the structure of an embodiment of the semiconductor nonvolatile memory transistor according to the invention in the completed state.
Figure 17:
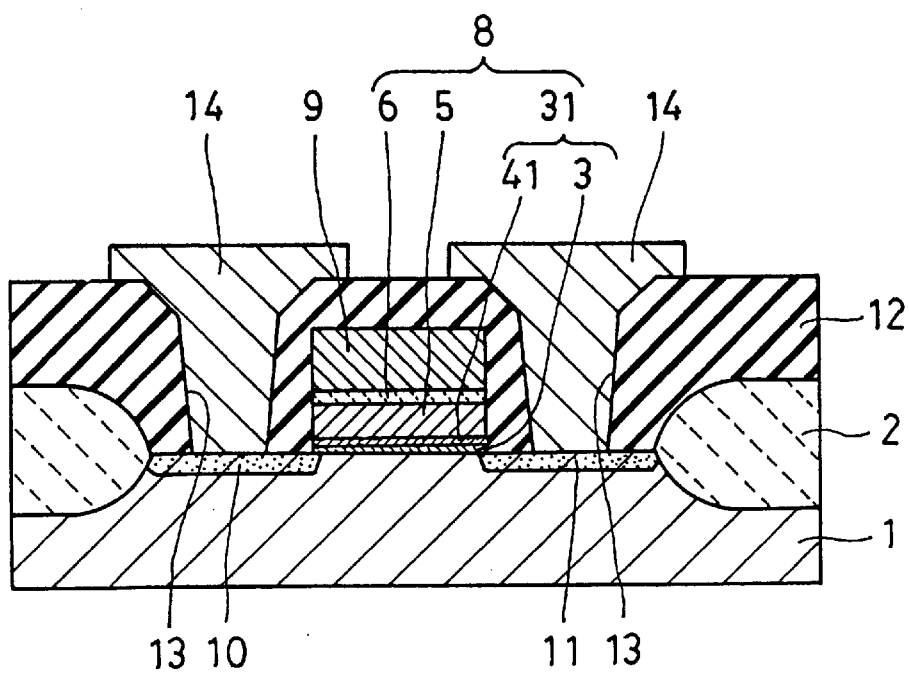
FIG. 17 is a schematic sectional view showing the structure of another embodiment of the semiconductor nonvolatile memory transistor according to the invention in the completed state.

Semiconductor Nonvolatile Memory Transistors According to the Invention: FIGS. 1 and 17

The structure of an embodiment of the MONOS nonvolatile memory transistor according to the invention will be explained with reference to the schematic sectional view of FIG. 1. This MONOS nonvolatile memory transistor is an N-channel semiconductor device.

The MONOS nonvolatile memory transistor shown in FIG. 1 has a field oxide film 2 provided around a memory device region on the surface of a semiconductor substrate 1 exhibiting P-type conductivity (first conductivity type).

A tunnel insulator film 31 composed of a silicon nitrided oxide film 3 and an oxygen-rich silicon nitrided oxide film 4 is provided on the semiconductor substrate 1, a memory insulator film 8 is constituted by providing a memory nitride film 5 and top oxide film 6 on the tunnel insulator film 31, and a memory gate electrode 9 is provided on the memory insulator film 8.

The tunnel insulator film 31 is a silicon nitrided oxide film containing oxygen and nitrogen. Its lower layer, the silicon nitrided oxide film 3, is composed of silicon, oxygen and nitrogen. It is an insulator film whose nitrogen content is greater than its oxygen content. Its upper layer, the oxygen-rich silicon nitrided oxide film 4, is also composed of silicon, oxygen and nitrogen. It is an insulator film whose oxygen content is greater than its nitrogen content.

Analyzing the specific compositions of the silicon nitrided oxide film 3 and the oxygen-rich silicon nitrided oxide film 4 constituting the tunnel insulator film 31 by x-ray photoelectron spectroscopy, they are, when estimated as SiOxNy compositions, insulator films of the compositions:

Silicon nitrided oxide film 3:
x=0.5, y=0.7 (approx.)

Oxygen-rich silicon nitrided oxide film 4:

x=1.1, y=0.3 (approx.).

A source 10 and a drain 11 composed of heavily doped layers exhibiting N-type conductivity (second conductivity type) are further provided on the surface of the semiconductor substrate 1 in self-alignment with the memory gate electrode 9.

An interlevel insulator 12 composed mainly of a silicon dioxide film is provided over the whole surface and interconnections 14 are provided through contact holes 13 formed in the interlevel insulator 12 to contact the source 10, the drain 11 and, though not illustrated, the memory gate electrode 9.

The MONOS nonvolatile memory transistor according to the invention is characterized in that its tunnel insulator film is constituted of a silicon nitrided oxide film containing oxygen and nitrogen and that the nitrogen content thereof in the vicinity of its interface with the semiconductor substrate 1 is greater than the nitrogen content thereof in the vicinity of its interface with the memory nitride film 5.

By this, the barrier height of the tunnel insulator film 31 to holes from the semiconductor substrate is lowered by the silicon nitrided oxide film with high nitrogen content, thereby enhancing the efficiency of hole injection into the memory insulator film 8 and increasing the erase operation speed of the N-channel MONOS nonvolatile memory transistor.

However, since the barrier height of the tunnel insulator film 31 from the viewpoint of holes captured in the memory nitride film 5 etc. remains high owing to the oxygen-rich silicon nitrided oxide film with low nitrogen content, escape of the holes to the side of the semiconductor substrate is impeded to prevent degradation of data retention characteristic. This effect will be discussed later in detail.

In the foregoing embodiment of FIG. 1, the tunnel insulator film 31 is constituted in the vicinity of its interface with the semiconductor substrate 1 of the silicon nitrided oxide film 3 whose nitrogen content is greater than its oxygen content and is constituted in the vicinity of its interface with the memory nitride film 5 of the oxygen-rich silicon nitrided oxide film 4 whose oxygen content is greater than its nitrogen content.

The tunnel insulator film of the MONOS nonvolatile memory transistor according to the invention is, however, not limited to this film structure.

Instead, as in another embodiment of the MONOS nonvolatile memory transistor according to the invention shown in FIG. 17, for example, the tunnel insulator film 31 can be constituted of a silicon nitrided oxide film 3 in the vicinity of its interface with the semiconductor substrate 1 and be constituted of a thin silicon oxide film 41 in the vicinity of its interface with the memory nitride film 5.

The embodiment described above indicates the configuration in the case of an N-channel MONOS-type semiconductor nonvolatile memory transistor. In the case of a P-channel semiconductor nonvolatile memory transistor, it suffices merely to make the semiconductor substrate 1 a semiconductor substrate of N-type conductivity and make the source 10 and the drain 11 heavily doped layers of P-type conductivity, with the remainder of the configuration being the same as that of the MONOS nonvolatile memory transistor shown in FIG. 1.

In the case of an N-channel MONOS nonvolatile memory transistor, the speed of the write operation speed is increased owing to improved efficiency of hole injection to the memory insulator film 8. In addition, escape of holes captured in the memory nitride film 5 etc. to the side of the semiconductor substrate is impeded to prevent degradation of data retention characteristic.

Embodiment of Fabrication Method: FIGS. 1–16

Next, an embodiment of the method of fabricating a MONOS nonvolatile memory transistor according to the invention will be explained.

A method of fabricating the MONOS nonvolatile memory transistor shown in FIG. 1 will be explained with reference to FIGS. 2–16 and 1. FIGS. 2–16 are schematic sectional views illustrating in order the stages of the process of fabricating the MONOS nonvolatile memory transistor shown in FIG. 1.

Figure 2:
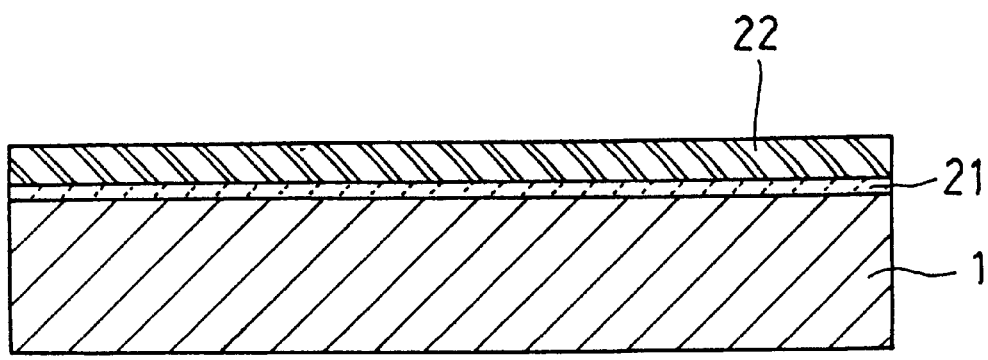
FIGS. 2 to 16 are schematic sectional views illustrating an embodiment of the method of fabricating the semiconductor nonvolatile memory transistor shown in FIG. 1 in the order of its steps.

First, as shown in FIG. 2, a semiconductor substrate 1 of P-type conductivity is oxidized in a mixed gas of oxygen and nitrogen to form a pad oxide film 21 composed of a 30 nm-thick silicon dioxide film over the whole surface of the semiconductor substrate 1.

Next, a silicon nitride film 22 is formed to a thickness of about 150 nm over the whole surface of the pad oxide film 21 by the CVD process at a temperature 740° C. using dichlorosilane ($SiH_2 Cl_2$) and ammonia ($NH_3$) as gases.

Figure 3:
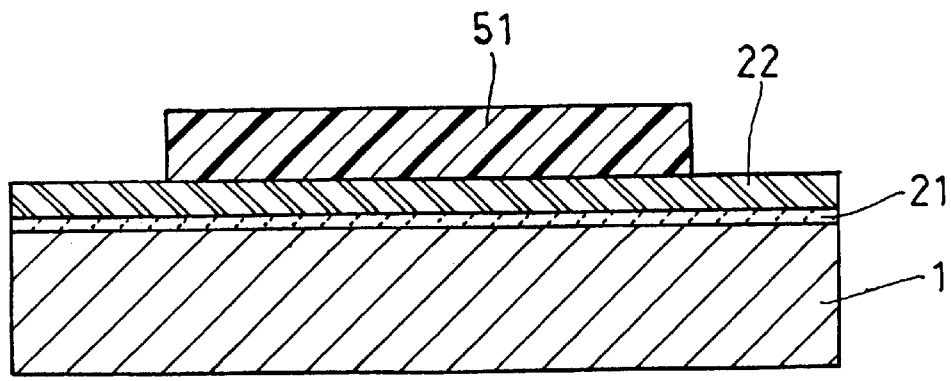

Then, as shown in FIG. 3, a photoresist 51, a photosensitive material, is formed over the whole surface of the silicon nitride film 22. The photoresist 51 is exposed using a prescribed photomask and developed to pattern it to expose a field region surrounding a memory device region.

Figure 4:
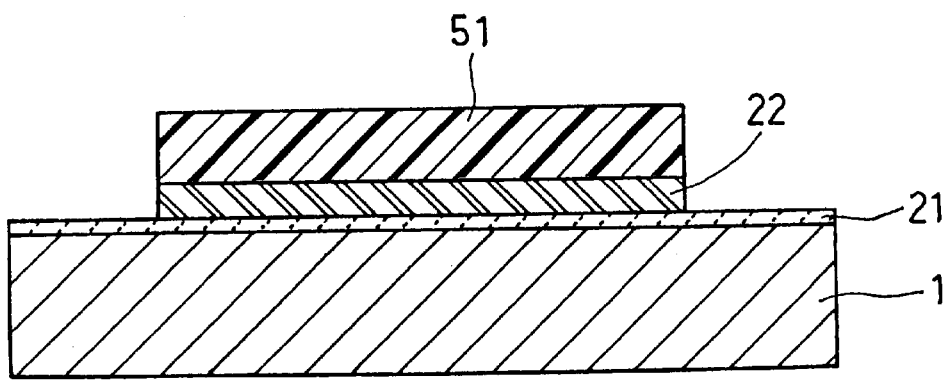

The field region portion of the silicon nitride film 22 is thereafter removed by etching using the photoresist 51 as an etching mask, as shown in FIG. 4. This etching of the silicon nitride film 22 is effected by the dry etching method using a mixed gas of $SF_6+CHF_3+He$.

The photoresist 51 used as the etching mask is then removed.

Figure 5:
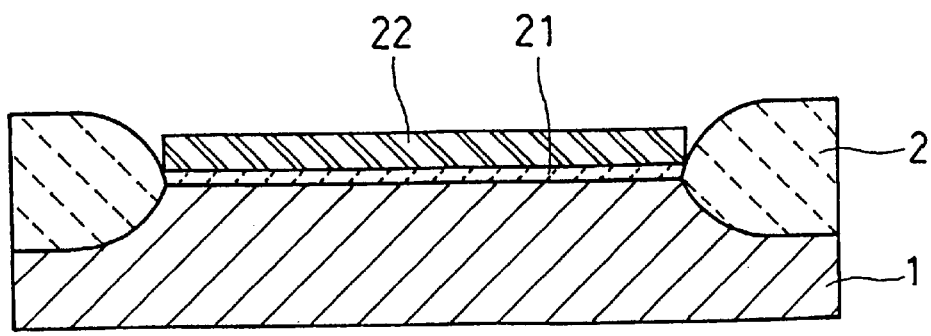

Next, the field regions of the semiconductor substrate 1 and the pad oxide film 21 surrounding the memory device region are oxidized using the silicon nitride film 22 as an oxidation-resistant mask. By this so-called selective oxidation, a field oxide film 2 is formed at the field region as shown in FIG. 5 to a thickness of 700 nm.

The selective oxidation is effected by oxidation in a steam oxidizing atmosphere at a temperature of 1000° C.

Figure 6:
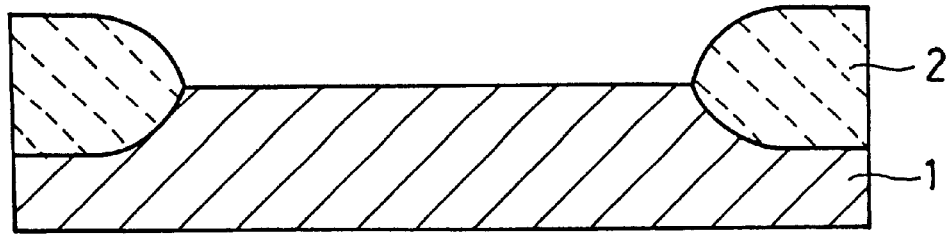

The silicon nitride film 22 is then removed with phosphoric acid ($H_3PO_4$) heated to 180° C. and the pad oxide film 21 is removed by etching with a buffered hydrofluoric acid solution. FIG. 6 shows the state with the silicon nitride film 22 and the pad oxide film 21 removed by these steps.

Figure 7:
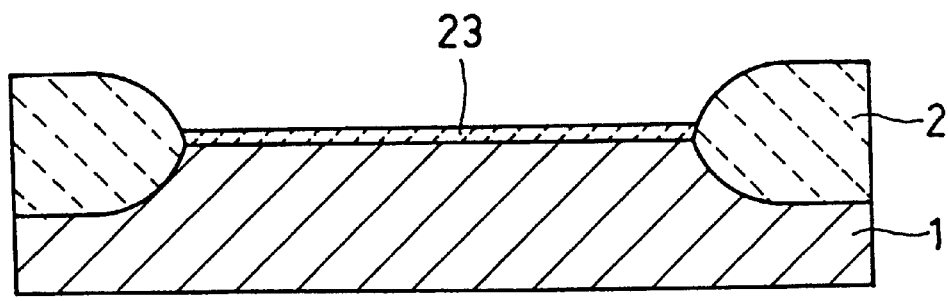

Next, oxidation is effected in a mixed gas of oxygen and nitrogen to form a sacrificial oxide film 23 composed of a silicon dioxide film over the whole surface of the semiconductor substrate 1 to a thickness of about 20 nm, as shown in FIG. 7, whereafter the sacrificial oxide film 23 is removed by etching with a buffered hydrofluoric acid solution.

The formation and removal of the sacrificial oxide film 23 is effected to improve the reliability of a memory insulator film formed by the processing steps that follows.

To be specific, when the field oxide film 2 for device isolation is formed by selective oxidation in the foregoing manner, nitrogen that is a constituent of the silicon nitride film 22 reacts with hydrogen in the steam atmosphere to form ammonia during the selective oxidation.

Because of this, a silicon nitride film is formed in the vicinity of the interface between the pad oxide film 21 and the semiconductor substrate 1 by reaction with ammonia. Since this silicon nitride film acts as an oxidation mask in the ensuing steps, the memory insulator film comes to have uneven thickness and degraded reliability. The sacrificial oxide film 23 is formed and removed to eliminate this phenomenon.

Figure 8:
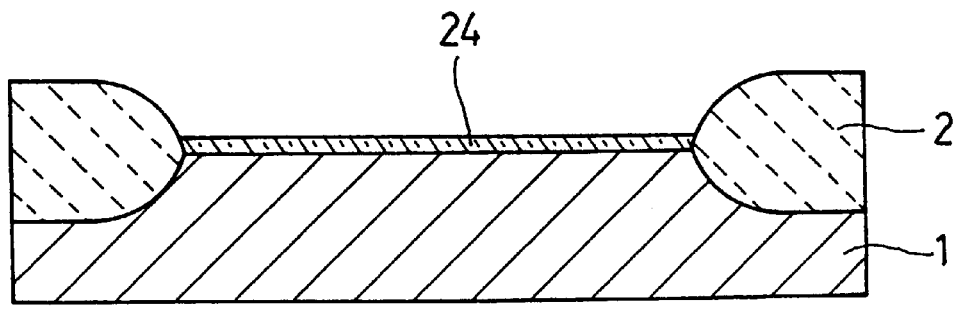

Next, oxidation is effected in a mixed gas of oxygen and nitrogen to form a silicon oxide film 24 composed of a silicon dioxide film over the whole surface of the memory device region of semiconductor substrate 1 to a thickness of about 2.2 nm, as shown in FIG. 8.

Figure 9:
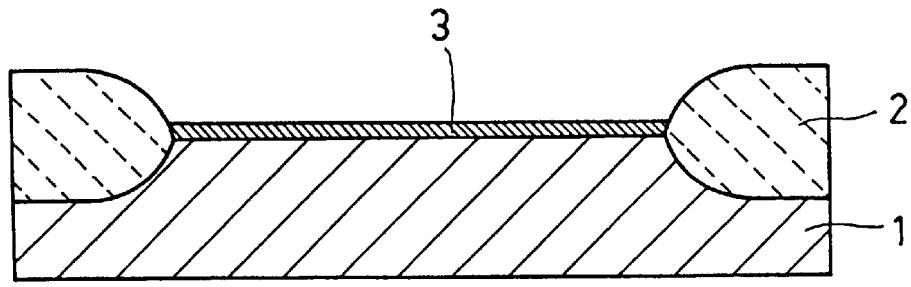

The silicon oxide film 24 is then nitrided in an ammonia ($NH_3$) atmosphere at a temperature of 950° C. to form a silicon nitrided oxide film 3 over the whole surface of the memory device region of the semiconductor substrate 1, as shown in FIG. 9.

Figure 10:
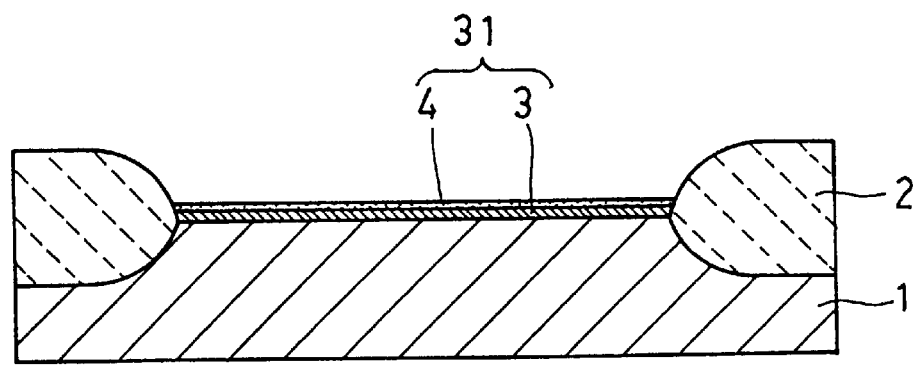

After this, oxidation is effected at a temperature of 900° C. in a nitrogen atmosphere containing about 0.2% oxygen to form an oxygen-rich silicon nitrided oxide film 4 on the surface of the silicon nitrided oxide film 3, as shown in FIG. 10, thereby forming a tunnel insulator film 31 constituted of the silicon nitrided oxide film 3 and the oxygen-rich silicon nitrided oxide film 4.

By this treatment in a nitrogen atmosphere containing a small amount of oxygen, the side of the tunnel insulator film 31 toward the semiconductor substrate 1 can be made of the silicon nitrided oxide film 3 whose nitrogen content is greater than its oxygen content and the upper layer of the tunnel insulator film 31 not in contact with the semiconductor substrate 1 can be made of the oxygen-rich silicon nitrided oxide film 4 of low nitrogen content.

Figure 11:
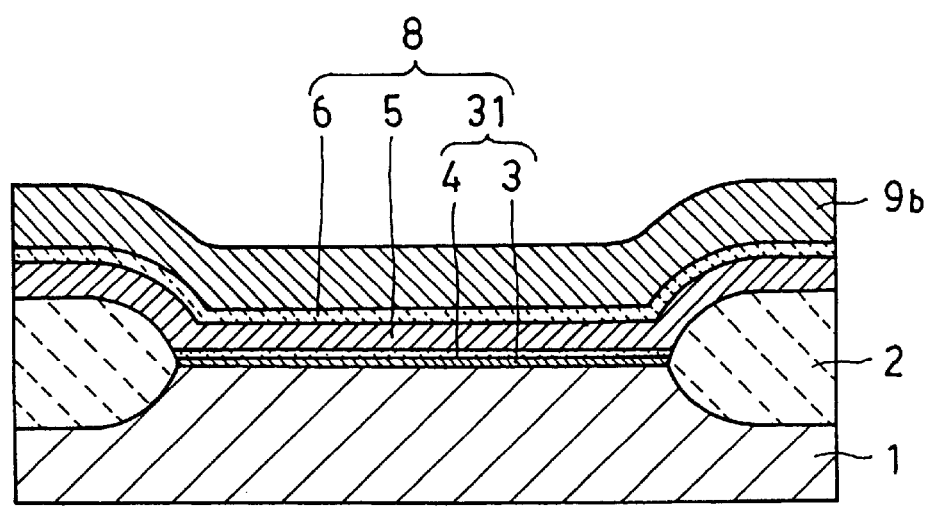

Next, as shown in FIG. 11, a memory nitride film 5 composed of a silicon nitride film is formed by the CVD process to a thickness of about 9 nm over the whole surface including the tunnel insulator film 31. The formation of the memory nitride film 5 is effected by the CVD process at a temperature of 700° C. using dichlorosilane ($SiH_2\ Cl_2$) and ammonia ($NH_3$) as gases.

Oxidation is further effected in a steam oxidizing atmosphere at a temperature of 950° C. to oxidize the memory nitride film 5 and form a top oxide film 6 composed of a silicon dioxide film on the memory nitride film 5.

By this oxidation, the thickness of the memory nitride film 5 becomes about 7 nm and the thickness of the top oxide film 6 becomes about 3 nm.

Still further, a memory gate electrode material 9b composed of a polycrystalline silicon film is formed over the whole surface to a thickness of about 450 nm by the CVD process at a temperature of 600° C. using monosilane ($SiH_4$) as gas.

Figure 12:
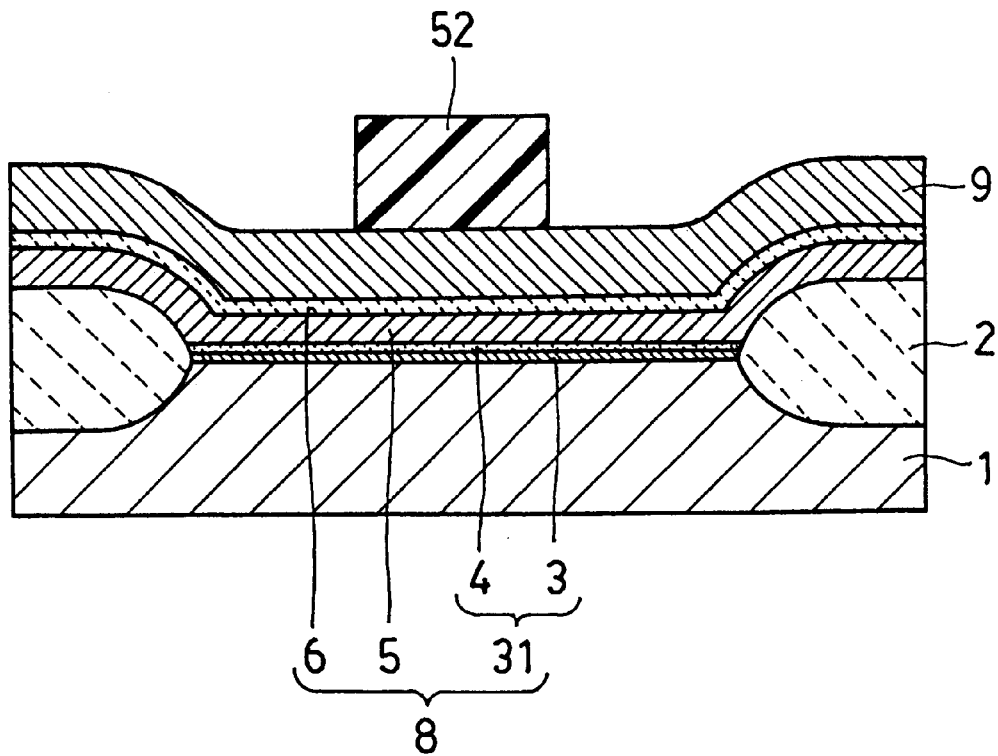

Next, after forming photoresist over the whole surface, exposure through a prescribed photomask and development are effected to form a photoresist 52 at the region where a memory gate electrode is to be formed, as shown in FIG. 12.

After this, using the photoresist 52 as an etching mask, the polysilicon film constituting the memory gate electrode material 9b is etched by the dry etching method using a mixed gas of $SF_6+O_2$ as etching gas.

Next, again using the photoresist 52 as an etching mask, the top oxide film 6, the memory nitride film 5, the oxygen-rich silicon nitrided oxide film 4, and the silicon nitrided oxide film 3 are etched by the dry etching method using a mixed gas of $CF_4++He+CBrF_3+O_2$ as etching gas. The photoresist 52 is thereafter removed.

Figure 13:
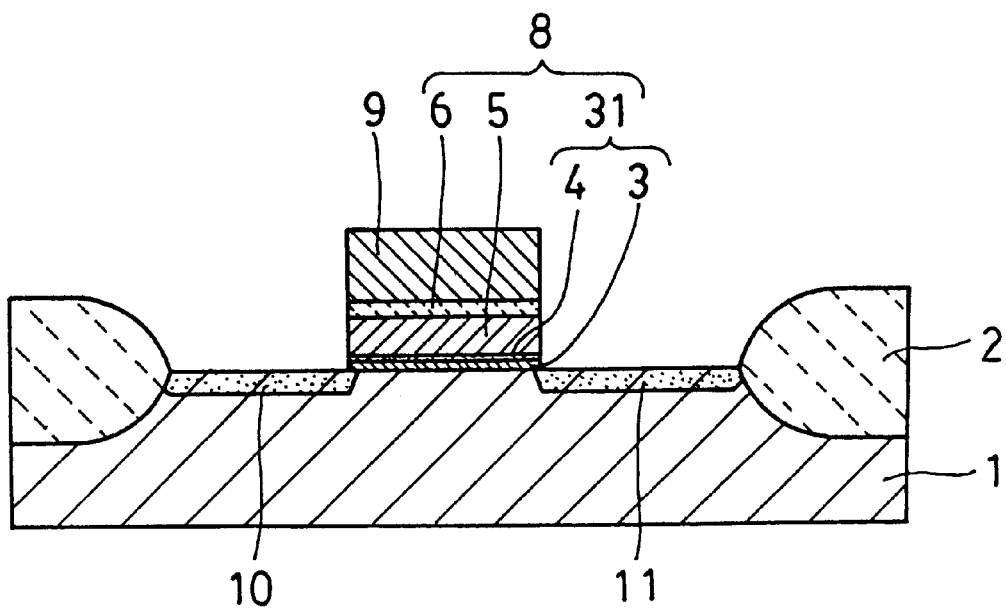

By this, as shown in FIG. 13, there is obtained a MONOS structure composed of the tunnel insulator film 31 constituted of the silicon nitrided oxide film 3 and the oxygen-rich silicon nitrided oxide film 4 provided on the semiconductor substrate 1, the memory insulator film 8 constituted of the memory nitride film 5 and the top oxide film 6, and the memory gate electrode 9.

Next, phosphorus, an impurity of N-type conductivity opposite from that of the semiconductor substrate 1, is ion implanted at an acceleration energy of 50 keV and an ion implantation dose of $3.5\times10^{15}$ atoms/cm$^2$ using the memory gate electrode 9 as an ion implantation mask.

By this, as also shown in FIG. 13, N-type heavily doped layers are formed on the semiconductor substrate 1 as a source 10 and a drain 11 of second conductivity type.

Figure 14:
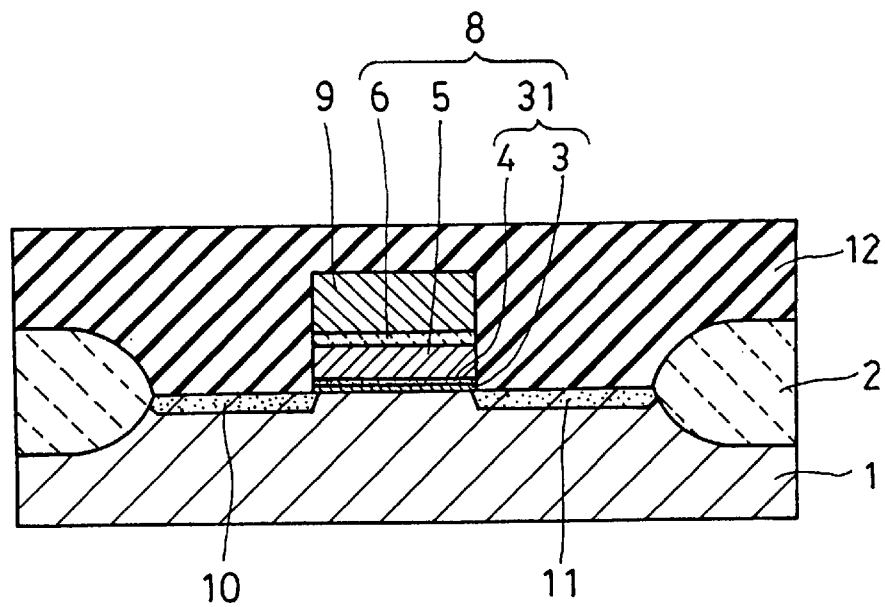

Thereafter, as shown in FIG. 14, an interlevel insulator 12 of a silicon dioxide film is formed over the whole surface.

Annealing is then conducted at a temperature of 900° C. in a nitrogen atmosphere to activate the N-type heavily doped layers and simultaneously effect reflow of the interlevel insulator 12.

Figure 15:
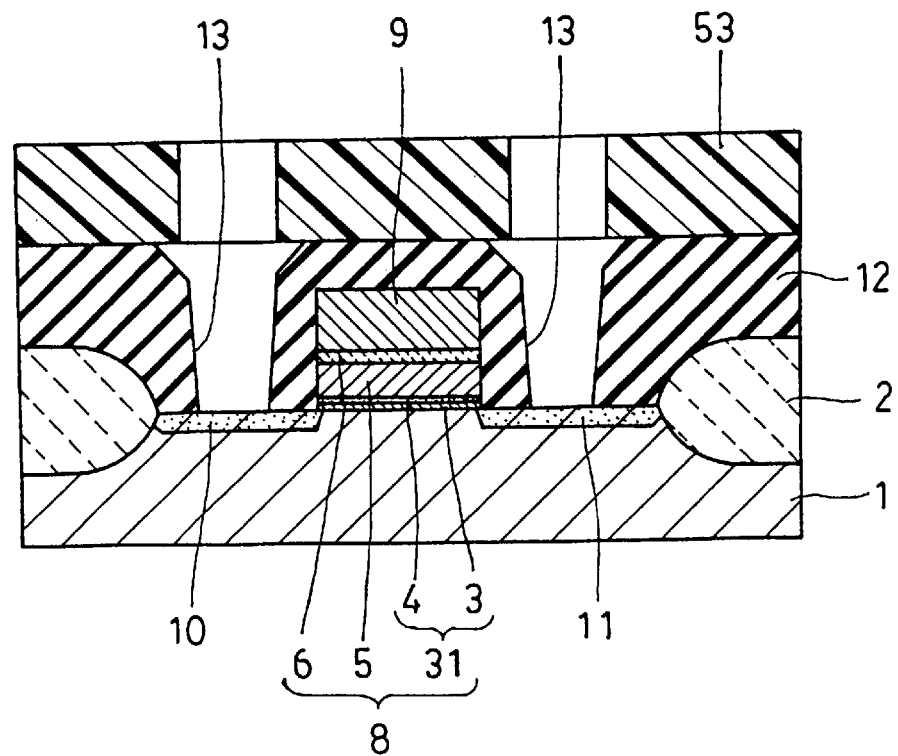

Further, as shown in FIG. 15, a photoresist 53 is formed for opening contact holes, i.e., connection holes, in the interlevel insulator 12.

Contact holes 13 are then formed as shown in FIG. 15 using the photoresist 53 as an etching mask.

The etching for forming the contact holes 13 is effected by the dry etching method using a mixed gas of $C_2F_6+He+CHF_3$ as etching gas. The photoresist 53 is thereafter removed.

Figure 16:
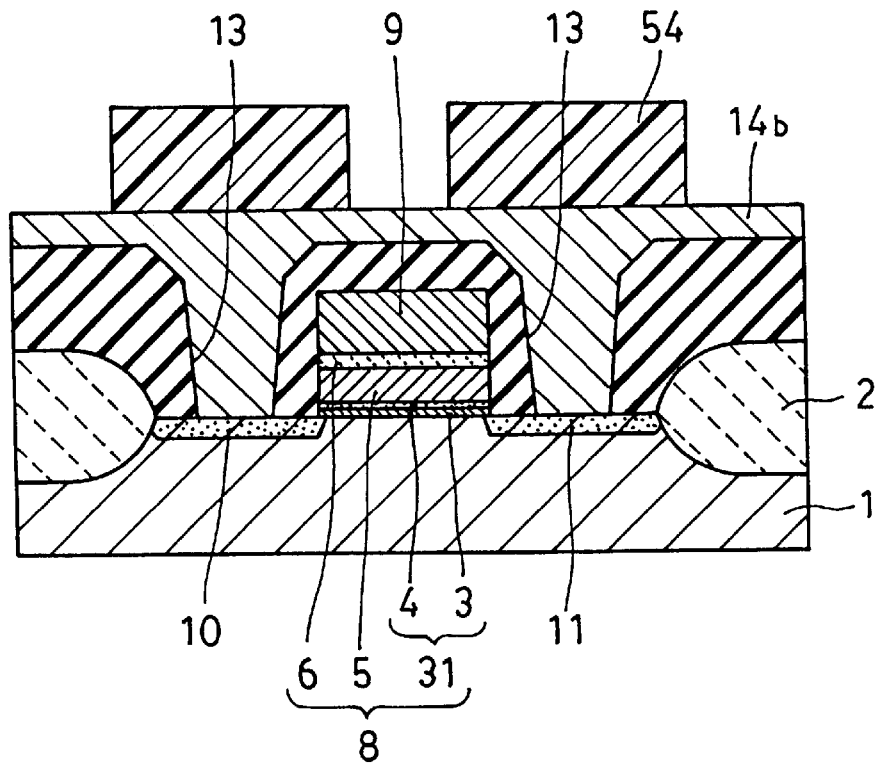

Next, as shown in FIG. 16, aluminum as an interconnection material 14b is provided over the whole surface including into the contact holes 13 and a patterned photoresist 54 for forming interconnections is formed thereon.

After this, the interconnection material 14b is etched using a photoetching technique.

This etching is effected by the dry etching method using a mixed gas of $BCl_3+CHCl_3+Cl_2+N_2$ as etching gas to form interconnections 14, as shown in FIG. 1. This completes the MONOS nonvolatile memory transistor shown in FIG. 1.

Other Embodiments of Fabrication Method

Other embodiments of the method of fabricating a MONOS nonvolatile memory transistor according to the invention will now be explained.

The embodiments described hereinafter differ from the embodiment explained with reference to FIGS. 2 to 16 only in the steps for forming the tunnel insulator film 31 of the MONOS nonvolatile memory transistor shown in FIG. 1. Since the other steps are the same as those of the embodiment described above, explanation thereof is omitted.

First, the tunnel insulator film formation steps according to a first embodiment of another fabrication method will be explained with reference to FIGS. 7 to 11.

As shown in FIG. 7, a field oxide film 2 is formed on the field region surrounding the memory device region on the semiconductor substrate 1, and a sacrificial oxide film 23 is formed on the memory device region and thereafter removed.

Oxidation is then effected in a mixed gas of oxygen and nitrogen to form a silicon oxide film 24 composed of a silicon dioxide film over the whole surface of the memory device region of semiconductor substrate 1 to a thickness of about 2.2 nm, as shown in FIG. 8. Further, the silicon oxide film 24 is nitrided in an ammonia ($NH_3$) atmosphere at a temperature of 950° C. to form a silicon nitrided oxide film 3, as shown in FIG. 9. Up to here the processing is effected by the same steps as in the earlier described fabricating method.

After this, instead of the oxidation in a nitrogen atmosphere containing oxygen in the aforesaid fabricating method, treatment is effected for a period of 20 seconds in a dinitrogen monoxide ($N_2O$) gas atmosphere at a temperature of 1000° C. using a lamp annealer to form an oxygen-rich silicon nitrided oxide film 4 on the surface of the silicon nitrided oxide film 3, as shown in FIG. 10.

By this, a tunnel insulator film 31 composed of the silicon nitrided oxide film 3 and the oxygen-rich silicon nitrided oxide film 4 is formed on the memory device region of the semiconductor substrate 1.

Owing to the treatment in the $N_2O$ gas atmosphere, the side of the tunnel insulator film 31 toward the semiconductor substrate 1 is the silicon nitrided oxide film 3 whose nitrogen content is greater than its oxygen content and the upper layer of the tunnel insulator film 31 not in contact with the semiconductor substrate 1 becomes the oxygen-rich silicon nitrided oxide film 4 of low nitrogen content.

The steps of forming on the tunnel insulator film 31 in succession a memory nitride film 5, a top oxide film 6 and a memory gate electrode material 9b, as shown in FIG. 11, and the ensuing steps, are the same as the steps in the fabricating method described earlier.

The tunnel insulator film formation steps according to a second embodiment of another fabrication method will next be explained with reference to FIGS. 7, 9 and 10.

As shown in FIG. 7, a field oxide film 2 is formed on the field region surrounding the memory device region on the semiconductor substrate 1, and a sacrificial oxide film 23 is formed on the memory device region and thereafter removed. Up to here the processing is effected by the same steps as in the earlier described methods of fabrication.

Then, after the sacrificial oxide film 23 has been removed, and without forming the silicon oxide film 24 shown in FIG. 8 as in the case of the earlier described methods of fabrication, treatment is immediately effected for a period of 20 seconds in a dinitrogen monoxide ($N_2O$) gas atmosphere at a temperature of 1000° C. using a lamp annealer to form a silicon nitrided oxide film 3 on the memory device region on the semiconductor substrate 1, as shown in FIG. 9.

After this, by continuing to use the lamp annealer, treatment is effected for a period of 10 seconds in an oxygen atmosphere at a temperature of 1000° C. to form an oxygen-rich silicon nitrided oxide film 4 on the surface of the silicon nitrided oxide film 3, as shown in FIG. 10.

By this, a tunnel insulator film 31 composed of the silicon nitrided oxide film 3 and the oxygen-rich silicon nitrided oxide film 4 is formed on the memory device region of the semiconductor substrate 1.

By this fabricating method also, the side of the tunnel insulator film 31 toward the semiconductor substrate 1 is the silicon nitrided oxide film 3 whose nitrogen content is greater than its oxygen content and the upper layer of the tunnel insulator film 31 not in contact with the semiconductor substrate 1 becomes the oxygen-rich silicon nitrided oxide film 4 of low nitrogen content.

The ensuing steps are the same as those of the fabricating methods described earlier.

The tunnel insulator film formation steps according to a third example of another fabrication method will next be explained with reference to FIGS. 8 and 10.

Up to the steps of forming a field oxide film 2 on the field region surrounding the memory device region on the semiconductor substrate 1 and of thereafter forming a silicon oxide film 24 on the device region, as shown in FIG. 8, the processing is effected by the same steps as in the first described fabricating method.

Then, after forming the silicon oxide film 24 as shown in FIG. 8, an ion implanter is used to implant nitrogen ions into the silicon oxide film 24, whereafter annealing is effected in a nitrogen atmosphere containing oxygen, thereby forming a tunnel insulator film 31 as a silicon nitrided oxide film 3 whose upper layer has been made into an oxygen-rich silicon nitrided oxide film 4, as shown in FIG. 10.

The tunnel insulator film formation steps according to a fourth embodiment of another fabrication method will next be explained with reference to FIGS. 18 and 20.

As shown in FIG. 7, a field oxide film 2 is formed on the field region surrounding the memory device region on the semiconductor substrate 1, and a sacrificial oxide film 23 is formed on the memory device region and thereafter removed. Up to here the processing is effected by the same steps as in the first described fabricating method.

Figure 18:
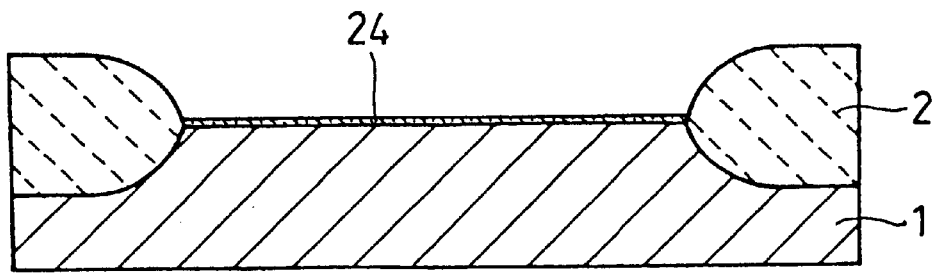
FIGS. 18 to 20 are schematic sectional views illustrating an embodiment of the method of fabricating the semiconductor nonvolatile memory transistor shown in FIG. 17 in the order of its steps.

Oxidation is then effected in a mixed gas of oxygen and nitrogen to form a silicon oxide film 24 composed of a silicon dioxide film over the whole surface of the memory device region of semiconductor substrate 1 to a thickness of about 1.1 nm, as shown in FIG. 18. Although this step is similar to the step explained with reference to FIG. 8 regarding the first explained fabricating method, the thickness of the formed silicon oxide film 24, about 2.2 nm in the case of the earlier explained fabricating method, is made about half this thickness in this example.

Figure 19:
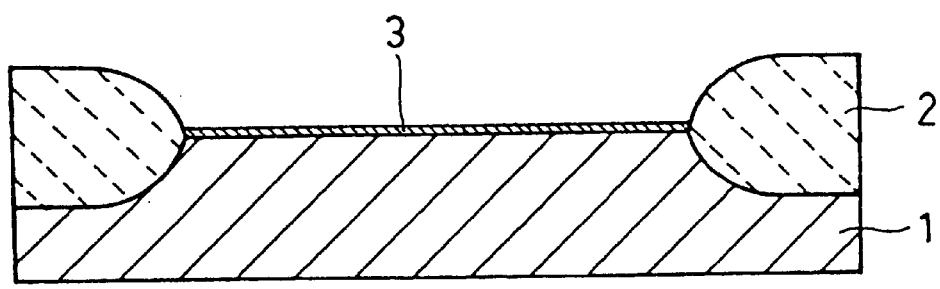

The silicon oxide film 24 is thereafter nitrided in an ammonia ($NH_3$) atmosphere at a temperature of 950° C. to form a silicon nitrided oxide film 3, as shown in FIG. 19. The thickness of the silicon nitrided oxide film 3 is also about 1.1 nm.

Figure 20:
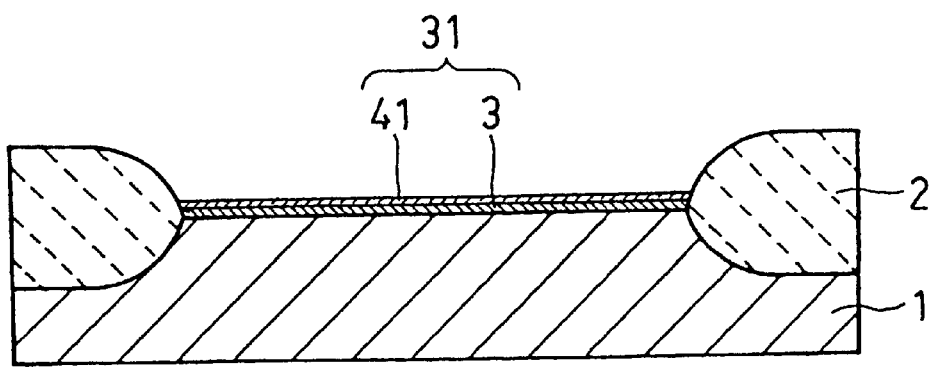

Next, as shown in FIG. 20, a thin silicon oxide film 41 composed of a silicon dioxide film is formed over the whole surface of the silicon nitrided oxide film 3 to a thickness of about 1.2 nm by the CVD process using monosilane ($SiH_4$) and oxygen ($O_2$) as reaction gases, thereby forming a tunnel insulator film 31 composed of the silicon nitrided oxide film 3 and the thin silicon oxide film 41.

The same steps as those explained with reference to FIGS. 11 to 16 regarding the first fabricating method are thereafter carried out to complete the MONOS nonvolatile memory transistor shown in FIG. 17.

The MONOS nonvolatile memory transistor of FIG. 17 fabricated by this fabricating method can provide the same effects as the MONOS nonvolatile memory transistor of FIG. 1 since the side of the tunnel insulator film 31 toward the semiconductor substrate 1 is the silicon nitrided oxide film 3 whose nitrogen content is greater than its oxygen content and the upper layer of the tunnel insulator film 31 not in contact with the semiconductor substrate 1 becomes the thin silicon oxide film 41 containing no nitrogen.

The foregoing embodiments of the fabricating method were explained taking as an embodiment mainly the case of fabricating an N-channel MONOS nonvolatile memory transistor. In the case of fabricating a P-channel MONOS nonvolatile memory transistor, it suffices to use a semiconductor substrate of N-type conductivity as the semiconductor substrate and form the source and the drain of heavily doped layers of P-type conductivity, with the other steps being the same as those of the fabricating methods described above.

Explanation Regarding the Effects of the Invention

An effect of the MONOS nonvolatile memory transistor according to the invention will be explained here with reference to the energy band diagram of FIG. 21.

This energy band diagram compares the case of the prior art in which the tunnel insulator film 31 is a silicon oxide film 32 (broken lines in the drawing) and the case of the invention in which the tunnel insulator film 31 is constituted of the silicon nitrided oxide film 3 and the oxygen-rich silicon nitrided oxide film 4 (solid lines in the drawing).

As a way of improving the speed on the erase side in the N-channel MONOS nonvolatile memory transistor according to the invention shown in FIG. 1, the tunnel insulator film 31 is provided on the side of the semiconductor substrate 1 with the silicon nitrided oxide film 3 formed by nitriding a silicon oxide film.

Figure 21:
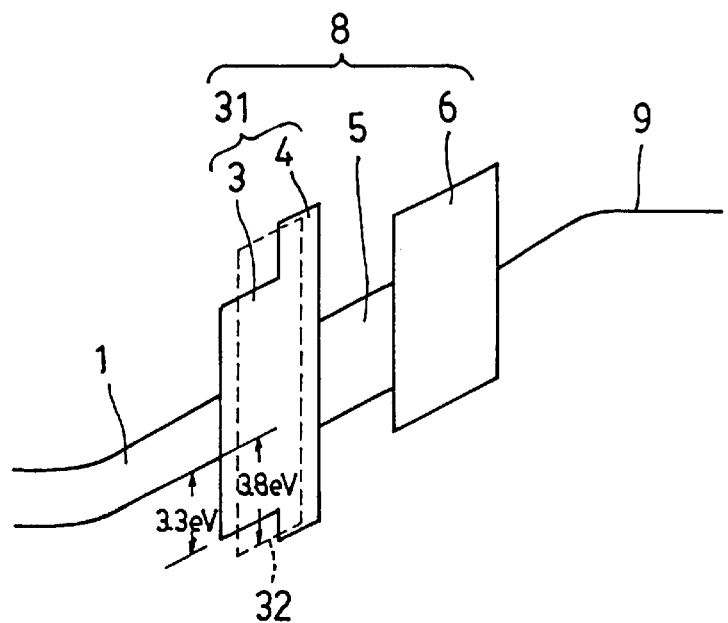
FIG. 21 is an energy band diagram for explaining an effect of the semiconductor nonvolatile memory transistor according to the invention.

Specifically, as shown in FIG. 21, by constituting the tunnel insulator film 31 of the silicon nitrided oxide film 3 in the vicinity of its interface with the semiconductor substrate 1, the barrier height to holes from the semiconductor substrate 1 becomes smaller (about 3.3 eV) than the barrier height of the silicon oxide film 32 denoted in broken lines (about 3.8eV).

As a result, the hole injection efficiency is improved to improve the erase operation.

Moreover, regarding the problem of the prior art that the data retention characteristic is degraded because the barrier height of the tunnel insulator film 31 is lowered from the viewpoint of holes captured in the memory nitride film 5, at the interface between the tunnel insulator film 31 and the memory nitride film 5, and at the interface between the memory nitride film 5 and the top oxide film 6, this is overcome by constituting the tunnel insulator film 31 of the oxygen-rich silicon nitrided oxide film 4 in the vicinity of its interface with the memory nitride film 5.

Specifically, since the barrier height of the tunnel insulator film 31 from the viewpoint of the captured holes is comparable to the barrier height of the silicon oxide film 32 denoted in broken lines, escape of holes to the side of the semiconductor substrate 1 is impeded to prevent degradation of the data retention characteristic.

The effect is also the same when the tunnel insulator film 31 is constituted of a silicon nitride film in the vicinity of its interface with the semiconductor substrate 1 and is constituted of a silicon oxide film in the vicinity of its interface with the memory nitride film 5.

When the invention is applied to a P-channel MONOS nonvolatile memory transistor, the write efficiency is enhanced and degradation of the data retention characteristic is prevented.

In other words, this invention can increase erase operation or write operation speed while preventing degradation of data retention characteristic, thereby achieving an improvement in the rewrite operation speed and an improvement in the data retention characteristic of a MONOS nonvolatile memory transistor.

It can therefore provide a semiconductor nonvolatile memory device of high reliability.

An effect of the invention will next be explained with reference to the characteristic diagrams of FIGS. 22 to 24.

Figure 22:
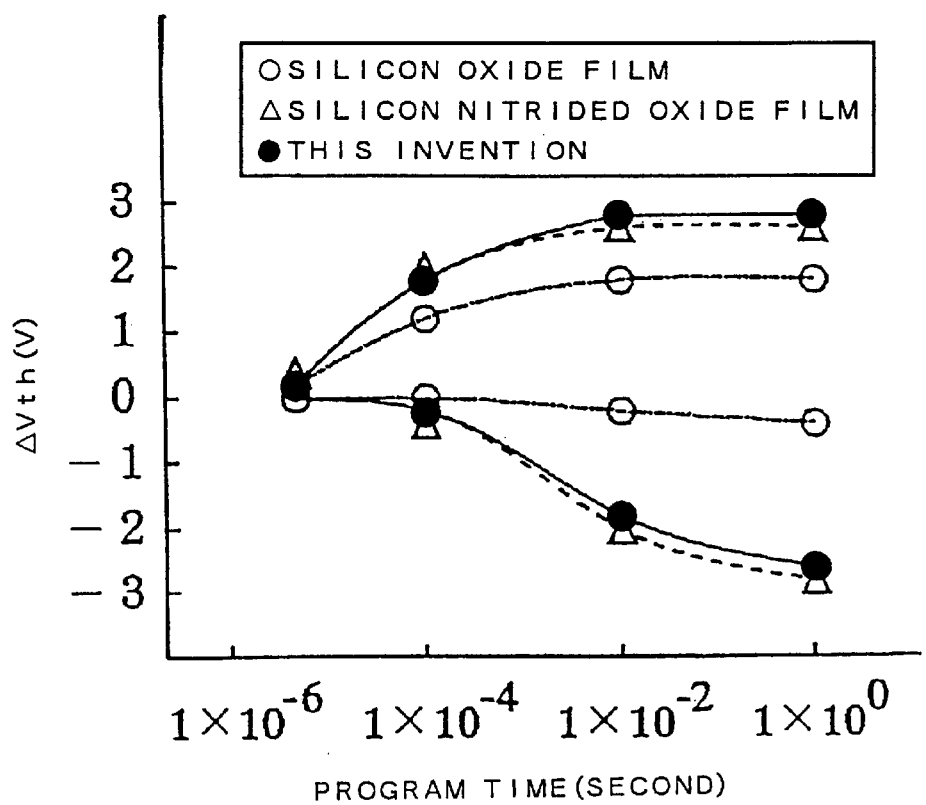
FIG. 22 is a graph showing characteristic curves of the correlation between program time and threshold voltage change ($\Delta$Vth) in the MONOS nonvolatile memory transistor according to the invention and in conventional MONOS nonvolatile memory transistors.

FIG. 22 shows data rewrite characteristics of a MONOS nonvolatile memory transistor fabricated by the fabricating method of the invention and MONOS nonvolatile memory transistors fabricated by the conventional fabricating method, for the case of N-channel transistors.

In the data rewrite characteristic graph of FIG. 22, the horizontal axis is scaled for the logarithm of the program time (sec) and the vertical axis is scaled for threshold voltage change ($\Delta$Vth) at the respective program times, the program voltage being 7 V, with threshold voltage increase operation by injection of electrons being defined as positive and threshold voltage decrease operation by injection of holes being defined as negative.

Here, threshold voltage increase operation by injection of electrons will be called write and threshold voltage decrease operation by injection of holes will be called erase.

As regards the conventional data rewrite characteristics when the tunnel insulator film is a silicon oxide film (indicated by the ○ marks in the drawing) and when it is a silicon nitrided oxide film (indicated by the △ marks in the drawing), it will be noted from FIG. 22 that the characteristics when the tunnel insulator film consists of a silicon oxide film are characterized by slow change of threshold voltage particularly on the erase side.

Specifically, a long period is required as the erase time during data rewrite, erase being impossible in the example of FIG. 22.

Figure 26:
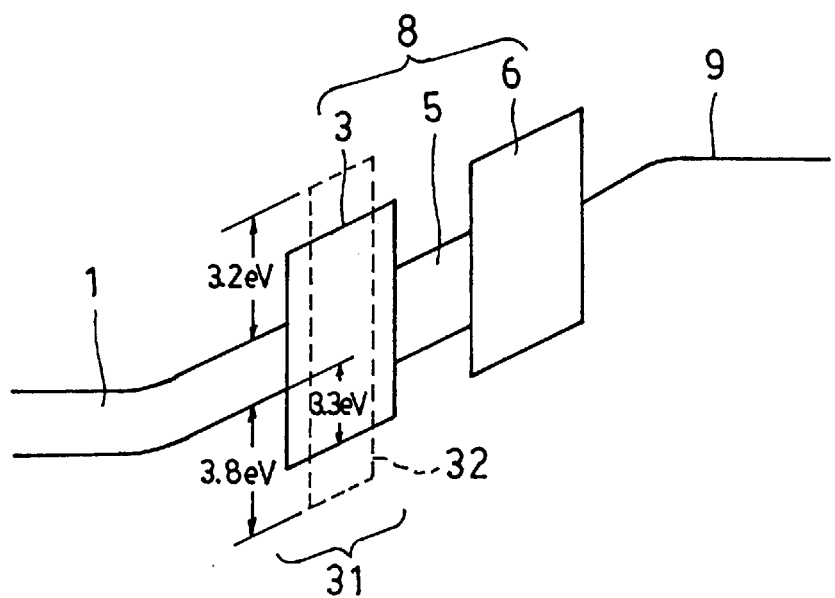
FIG. 26 is an energy band diagram of a conventional MONOS nonvolatile memory transistor.

As was explained earlier with reference to FIG. 26, the reason for the problem of prolonged erase time is that since the erase operation is by way of hole injection from the semiconductor substrate, the barrier height of the tunnel insulator film from the viewpoint of the semiconductor substrate is higher than that to electron injection during write, which lowers the probability of holes passing over the barrier.

Therefore, in another conventional technique, as a way for shortening the erase time there is adopted that of constituting the tunnel insulator film of a silicon nitrided oxide film so as to lower the barrier height to holes. Specifically, as indicated by the triangular plot points in FIG. 22, changing the tunnel insulator film from a silicon oxide film to a silicon nitrided oxide film improves the characteristic on the erase side and enables an increase in the data write speed of the MONOS nonvolatile memory transistor.

As indicated by the solid circle plot points in FIG. 22, when the tunnel insulator film is constituted of a silicon nitrided oxide film and an oxygen-rich silicon nitrided oxide film in accordance with the invention, the write characteristic exhibited is comparable to that when the tunnel insulator film is formed of the conventional silicon nitrided oxide film.

Thus when the write characteristic is improved on the erase side, the conventional tunnel insulator film consisting solely of a silicon nitrided oxide film involves a problem regarding data retention characteristic. The effect of improving the data retention characteristic will be explained with reference to FIGS. 23 and 24.

Figure 23:
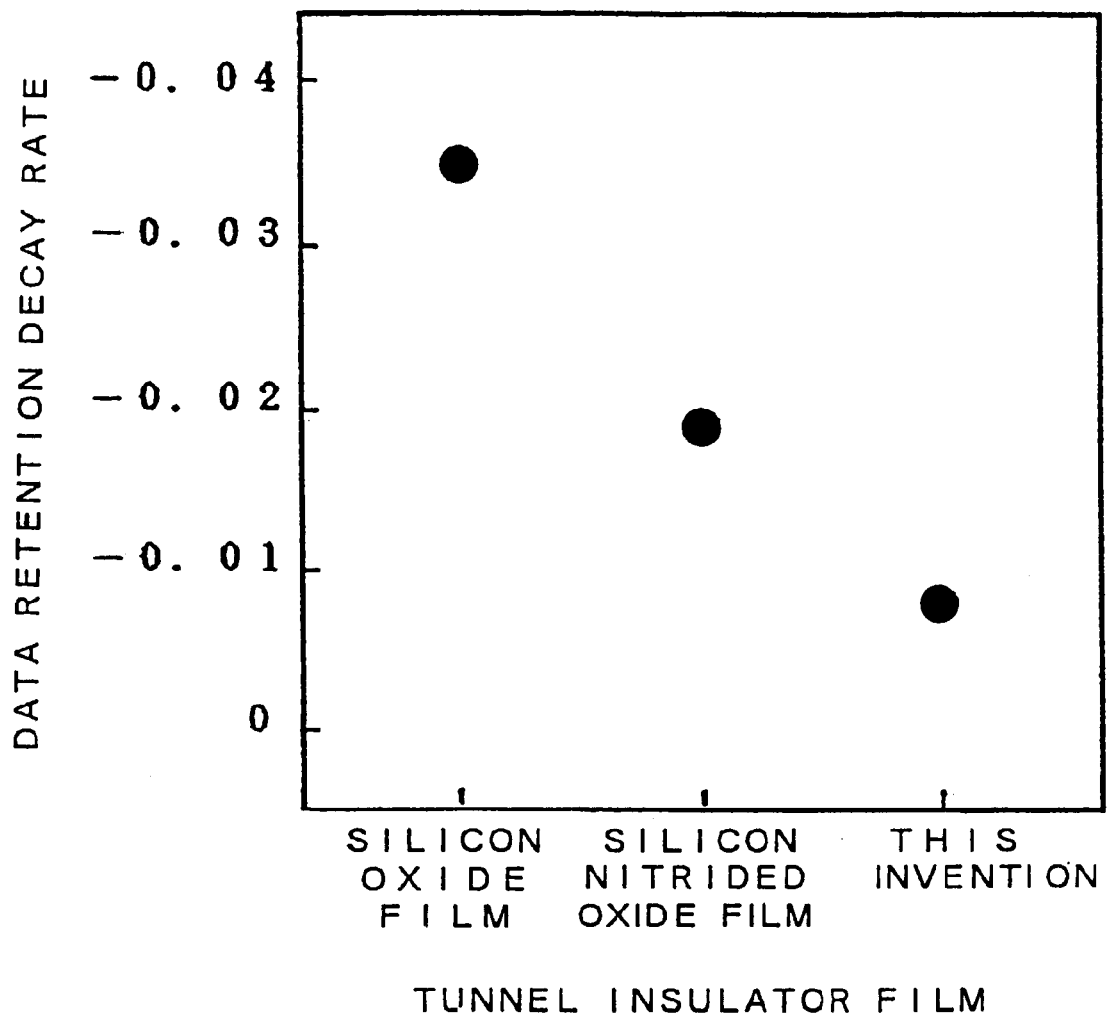
FIG. 23 is a graph showing the data retention decay rate on the write side in the MONOS nonvolatile memory transistor according to the invention and in conventional MONOS nonvolatile memory transistors.
Figure 24:
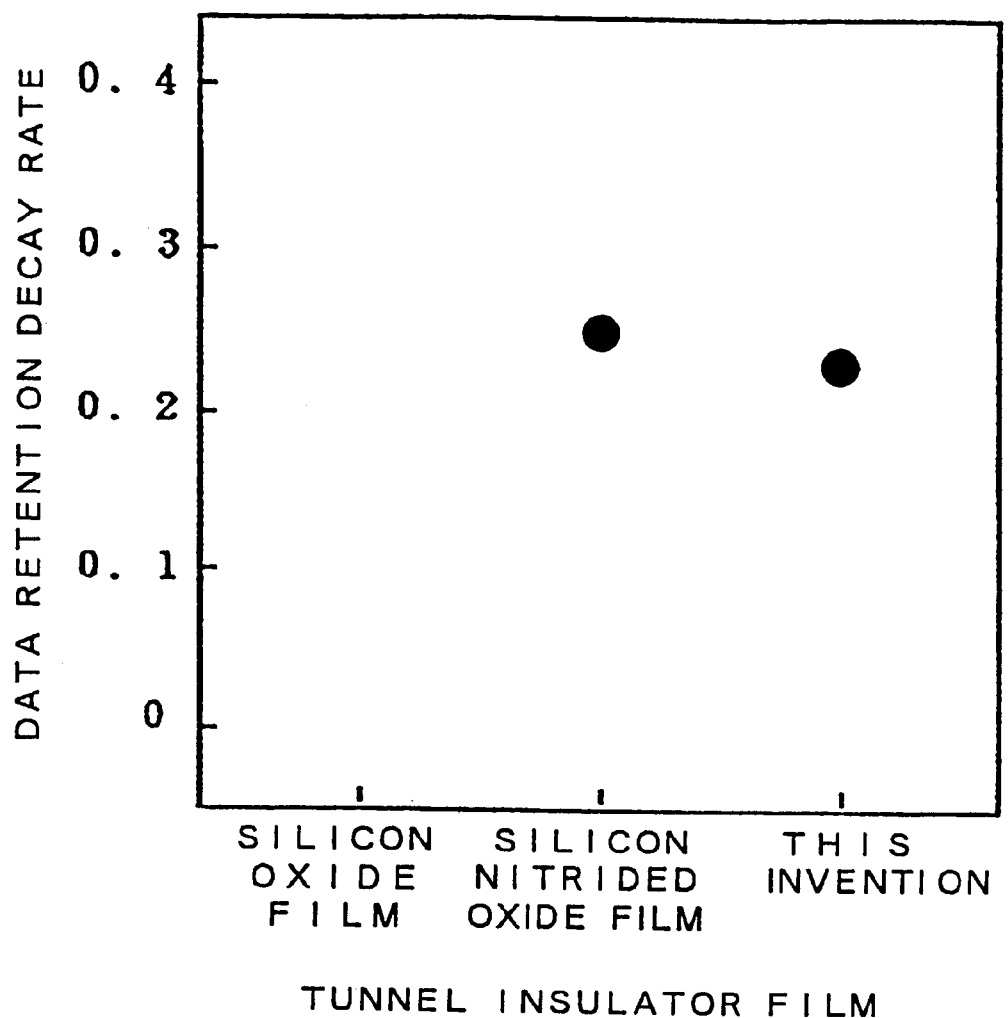
FIG. 24 is a graph showing the data retention decay rate on the erase side in the MONOS nonvolatile memory transistor according to the invention and in conventional MONOS nonvolatile memory transistors.
Figure 25:
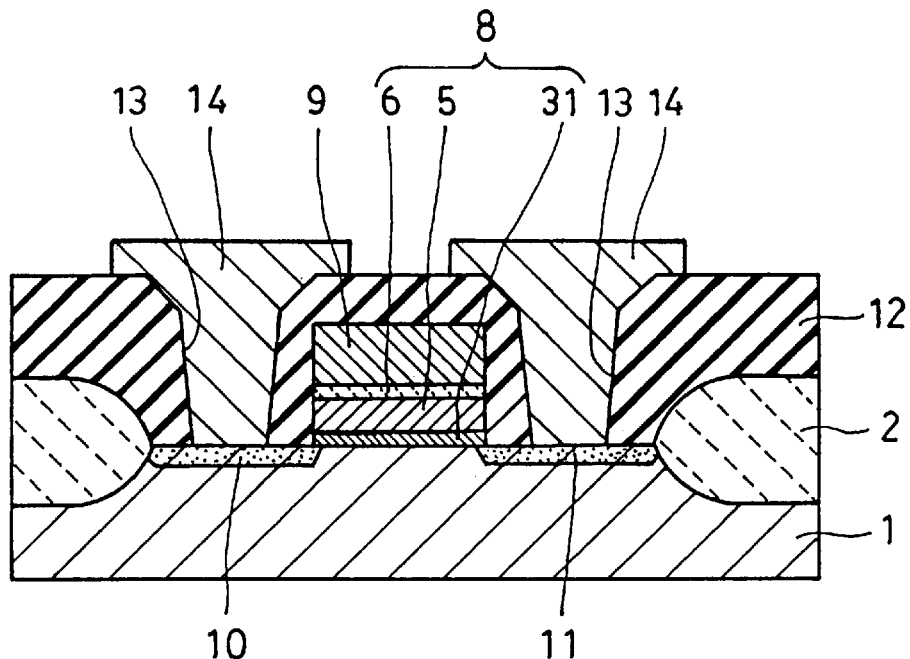
FIG. 25 is a schematic sectional view showing the structure of a conventional MONOS nonvolatile memory transistor.

In each of FIGS. 23 and 24, the condition of the tunnel insulator film is indicated on the horizontal axis for the conventional case in which the tunnel insulator film is a silicon oxide film, the conventional case in which it is a silicon nitrided oxide film, and the case of the invention, and the data retention decay rate, i.e., the slope relative to time of the threshold voltage determined from the data retention characteristic is indicated on the vertical axis.

The closer the data retention decay rate is to zero, the better is the data retention characteristic.

FIG. 23 shows the characteristics on the electron-injected write side. Therefore, since the threshold voltage after write shifts in the decrease direction with passage of time, the data retention decay rates are indicated on the vertical axis as negative values.

In the invention, since, as shown by the energy band diagram of FIG. 21, the film thickness is increased by nitridation and the barrier height from the viewpoint of captured electrons is comparable to that of a silicon oxide film, the data retention decay rate therefore exhibits a value near zero and the data retention characteristic is enhanced in comparison with the prior art.

FIG. 24 shows the characteristics on the hole-injected erase side. Therefore, since the threshold voltage after erase shifts in the increase direction with passage of time, the data retention decay rates are indicated on the vertical axis as positive values.

Since, as shown by the energy band diagram of FIG. 21, the barrier height from the viewpoint of captured holes is greater than in the case of a silicon nitrided oxide film, the data retention characteristic is also enhanced on the erase side.

No data for the case of a silicon oxide film is shown in FIG. 24 because, as shown in FIG. 22, hole injection is substantially impossible in the case of the conventional tunnel insulator film made of a silicon oxide film.

Thus, although the structuring of the tunnel insulator film of a silicon nitrided oxide film conventionally practiced to improve the characteristic on the erase side also lowers the barrier height of the tunnel insulator film from the viewpoint of injected holes, thereby allowing holes to escape readily to the semiconductor substrate side and giving rise to the problem of degrading the data retention characteristic, the invention lowers the barrier height on the semiconductor substrate side to heighten hole injection probability and enhance the erase characteristic and raises the barrier height on the memory nitride film side to reduce escape of holes to the semiconductor substrate side, thereby enhancing the data retention characteristic.

In the case of a P-channel MONOS nonvolatile memory transistor, the speed of write operation is increased without degrading the data retention characteristic.

As explained in the foregoing, the semiconductor nonvolatile memory transistor according to the invention increases the data rewrite speed without degrading the data retention characteristic.

By the fabricating method of the invention, moreover, a semiconductor nonvolatile memory transistor with a good data retention characteristic and high reliability and also capable of rapid data rewrite can be easily fabricated.

What is claimed is:

1. A semiconductor nonvolatile memory transistor comprising a semiconductor substrate, a memory insulator film on the semiconductor substrate composed of a tunnel insulator film, a memory nitride film and a top oxide film, and a memory gate electrode on the memory insulator film, the tunnel insulator film being constituted of a silicon nitrided oxide film containing oxygen and nitrogen, and a nitrogen content of the tunnel insulator film in the vicinity of an interface with the semiconductor substrate being greater than a nitrogen content thereof in the vicinity of an interface with the memory nitride film.

2. A semiconductor nonvolatile memory transistor according to claim 1, wherein the tunnel insulator film is constituted in the vicinity of the interface with the semiconductor substrate of a silicon nitrided oxide film whose nitrogen content is greater than its oxygen content and is constituted in the vicinity of its interface with the memory nitride film of an oxygen-rich silicon nitrided oxide film whose oxygen content is greater than its nitrogen content.

3. A semiconductor nonvolatile memory transistor comprising a semiconductor substrate, a memory insulator film on the semiconductor substrate composed of a tunnel insulator film, a memory nitride film and a top oxide film, and a memory gate electrode on the memory insulator film, the tunnel insulator film being constituted in the vicinity of an interface with the semiconductor substrate of a silicon nitride film and being constituted in the vicinity of an interface with the memory nitride film of a silicon oxide film.

4. A method of fabricating a semiconductor nonvolatile memory transistor comprising:

a step of forming a pad oxide film on a semiconductor substrate of a first conductivity type, a step of forming a silicon nitride film on the pad oxide film, a step of etching the silicon nitride film by photoetching to leave a memory device region on the semiconductor substrate, a step of forming a field oxide film around the memory device region by selective oxidation using silicon nitride film left at the memory device region as an oxidation-resistant mask, a step of removing the silicon nitride film and the pad oxide film from the semiconductor substrate, a step of forming a sacrificial oxide film on the semiconductor substrate by oxidation, a step of removing the sacrificial oxide film, a step of forming on the memory device region of the semiconductor substrate a tunnel insulator film composed of a silicon nitrided oxide film containing oxygen and nitrogen and having a nitrogen content in the vicinity of an interface with the semiconductor substrate that is greater than a nitrogen content in the vicinity of its surface, a step of forming a memory nitride film on the tunnel insulator film, a step of forming on the memory nitride film a top oxide film composed a silicon oxide film, a step of forming a memory gate electrode on the top oxide film, a step of forming a source and a drain composed of heavily doped layers of a second conductivity type at regions of the memory device region of the semiconductor substrate self-aligned with the memory gate electrode, a step of forming an interlevel insulator composed mainly of a silicon dioxide film over the whole surface a step of annealing to activate the heavily doped layers, a step of forming contact holes by photoetching at locations of the interlevel insulator corresponding to the memory gate electrode, the source and the drain, and a step of forming interconnections through the contact holes to connect with the memory gate electrode, the source and the drain.

5. A method of fabricating a semiconductor nonvolatile memory transistor according to claim 4, wherein the step of forming the tunnel insulator film comprises:

a step of forming a silicon oxide film on the memory device region of the semiconductor substrate by oxidation, a step of nitriding the silicon oxide film into a silicon nitrided oxide film constituting a tunnel insulator film, and a step of further oxidizing the silicon nitrided oxide film at the vicinity of a surface thereof to make the vicinity of the surface into an oxygen-rich silicon nitrided oxide film whose oxygen content is high.

6. A method of fabricating a semiconductor nonvolatile memory transistor according to claim 4, wherein the step of forming the tunnel insulator film comprises:

a step of forming a silicon oxide film on the memory device region of the semiconductor substrate by oxidation, a step of nitriding the silicon oxide film into a silicon nitrided oxide film constituting a tunnel insulator film, and a step of further treating the silicon nitrided oxide film in a nitrogen atmosphere containing oxygen to make the vicinity of a surface thereof into an oxygen-rich silicon nitrided oxide film whose oxygen content is great.

7. A method of fabricating a semiconductor nonvolatile memory transistor according to claim 4, wherein the step of forming the tunnel insulator film comprises:

a step of effecting nitridation and oxidation to form on a surface of the memory device region on the semiconductor substrate a silicon nitrided oxide film constituting a tunnel insulator film, and a step of further annealing the silicon nitrided oxide film in an oxygen atmosphere to make the vicinity of a surface thereof into an oxygen-rich silicon nitrided oxide film whose oxygen content is great.

8. A method of fabricating a semiconductor nonvolatile memory transistor according to claim 4, wherein the step of forming the tunnel insulator film comprises:

a step of forming a silicon oxide film on the memory device region of the semiconductor substrate by oxidation, and a step of injecting nitrogen ions into the silicon oxide film and then effecting annealing in a nitrogen atmosphere containing oxygen to form a tunnel insulator film composed of a silicon nitrided oxide film whose nitrogen content is greater than its oxygen content in the vicinity of an interface thereof with the semiconductor substrate and whose oxygen content is greater than its nitrogen content in the vicinity of a surface thereof.

9. A method of fabricating a semiconductor nonvolatile memory transistor comprising:

a step of forming a pad oxide film on a semiconductor substrate of a first conductivity type, a step of forming a silicon nitride film on the pad oxide film, a step of etching the silicon nitride film by photoetching to leave a memory device region on the semiconductor substrate, a step of forming a field oxide film around the memory device region by selective oxidation using silicon nitride film left at the memory device region as an oxidation-resistant mask, a step of removing the silicon nitride film and the pad oxide film from the semiconductor substrate, a step of forming a sacrificial oxide film on the semiconductor substrate by oxidation, a step of removing the sacrificial oxide film, a step of forming a silicon oxide film on the memory device region of the semiconductor substrate by oxidation, a step of nitriding the silicon oxide film into a silicon nitrided oxide film constituting a tunnel insulator film, and a step of effecting a CVD process to form on a surface of the silicon nitrided oxide film a thin silicon oxide film constituting a portion of the tunnel insulator film, a step of forming a memory nitride film on the tunnel insulator film, a step of forming on the memory nitride film a top oxide film composed a silicon oxide film, a step of forming a memory gate electrode on the top oxide film, a step of forming a source and a drain composed of heavily doped layers of a second conductivity type at regions of the memory device region of the semiconductor substrate self-aligned with the memory gate electrode, a step of forming an interlevel insulator composed mainly of a silicon dioxide film over the whole surface a step of annealing to activate the heavily doped layers, a step of forming contact holes by photoetching at locations of the interlevel insulator corresponding to the memory gate electrode, the source and the drain, and a step of forming interconnections through the contact holes to connect with the memory gate electrode, the source and the drain.

* * * * *